United States Patent
Kim et al.

(10) Patent No.: US 10,529,779 B2
(45) Date of Patent: Jan. 7, 2020

(54) METHODS AND SYSTEMS FOR MANUFACTURING IMAGE SENSORS

(71) Applicant: Samsung Electronics Co., Ltd., Suwon-si, Gyeonggi-do (KR)

(72) Inventors: Yo-han Kim, Seoul (KR); Jong-wook Jeon, Suwon-si (KR); Ui-hui Kwon, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 169 days.

(21) Appl. No.: 15/869,466

(22) Filed: Jan. 12, 2018

(65) Prior Publication Data

US 2019/0058010 A1   Feb. 21, 2019

(30) Foreign Application Priority Data

Aug. 21, 2017   (KR) .......................... 10-2017-0105509

(51) Int. Cl.
| | |
|---|---|
| G06F 17/50 | (2006.01) |
| H01L 27/30 | (2006.01) |
| H01L 27/146 | (2006.01) |
| H01L 33/08 | (2010.01) |
| H01L 27/12 | (2006.01) |

(52) U.S. Cl.
CPC ........ *H01L 27/307* (2013.01); *G06F 17/5036* (2013.01); *G06F 17/5068* (2013.01); *H01L 27/1214* (2013.01); *H01L 27/14609* (2013.01); *H01L 27/14632* (2013.01); *H01L 27/14636* (2013.01); *H01L 27/14647* (2013.01); *H01L 27/14667* (2013.01); *H01L 27/14685* (2013.01); *H01L 27/14687* (2013.01); *H01L 33/08* (2013.01)

(58) Field of Classification Search
USPC ....................................................... 716/122
See application file for complete search history.

(56) References Cited

U.S. PATENT DOCUMENTS

| | | |
|---|---|---|
| 8,793,637 B2 | 7/2014 | Gordin et al. |
| 8,957,358 B2 | 2/2015 | Wan et al. |
| 9,021,412 B2 | 4/2015 | Wu et al. |
| 9,060,143 B2 | 6/2015 | Honda et al. |

(Continued)

*Primary Examiner* — Mohammed Alam
(74) *Attorney, Agent, or Firm* — Harness, Dickey & Pierce, P.L.C.

(57) ABSTRACT

A method of manufacturing an image sensor that includes first and second semiconductor chips includes receiving manufacturing data respectively associated with the first and second semiconductor chips, processing the manufacturing data to determine a capacitance and a resistance of a pixel signal transmission line to which a pixel signal generated by each pixel of the plurality of pixels is transmitted, where the capacitance and the resistance corresponding to position information associated with each pixel of the plurality of pixels, and determining predicted characteristics of the image sensor based on the determined capacitance and resistance, prior to the first semiconductor chip being electrically connected to the second semiconductor chip. The first semiconductor chip may be electrically connected to the second semiconductor chip to form the image sensor based on a determination that the predicted characteristics of the image sensor at least meet a particular set of one or more target values.

20 Claims, 8 Drawing Sheets

(56) References Cited

U.S. PATENT DOCUMENTS

| | | |
|---|---|---|
| 9,070,545 B2 | 6/2015 | Byeon |
| 9,252,178 B2 | 2/2016 | Park et al. |
| 9,275,182 B2 | 3/2016 | Sproch et al. |
| 9,633,149 B2 | 4/2017 | Yen et al. |
| 9,634,060 B2 | 4/2017 | Shizukuishi |
| 2013/0007692 A1 | 1/2013 | Yeh et al. |
| 2016/0034633 A1 | 2/2016 | Han et al. |
| 2017/0033141 A1 | 2/2017 | Sugihara |
| 2017/0063351 A1* | 3/2017 | Kurokawa ....... H03K 3/356104 |
| 2017/0092682 A1 | 3/2017 | Choi |
| 2017/0371856 A1* | 12/2017 | Can .................... G06F 17/2881 |
| 2018/0284735 A1* | 10/2018 | Cella ................... G05B 23/024 |
| 2018/0349538 A1* | 12/2018 | Bhosale ................. H01L 22/20 |
| 2019/0012013 A1* | 1/2019 | Teranishi .............. G06F 3/0412 |
| 2019/0058010 A1* | 2/2019 | Kim ..................... H01L 27/307 |

\* cited by examiner

METHODS AND SYSTEMS FOR MANUFACTURING IMAGE SENSORS

CROSS-REFERENCE TO RELATED APPLICATION

This application claims the benefit, under 35 U.S.C. § 119, of Korean Patent Application No. 10-2017-0105509, filed on Aug. 21, 2017, in the Korean Intellectual Property Office, the disclosure of which is incorporated herein in its entirety by reference.

BACKGROUND

The inventive concepts relate to image sensors, and more particularly, to methods of manufacturing image sensors and computing systems configured to manufacture the image sensors.

An image sensor is a semiconductor device configured to convert an optical image into an electric signal. An image sensor may include a pixel array that further includes a plurality of pixels arranged in a two-dimensional (2D) matrix shape. Each pixel of the plurality of pixels may output ("generate") an image signal based on light energy of light that is received at ("incident on") the pixel. Each pixel of the plurality of pixels may integrate photocharges corresponding to the amount of light incident through a photodiode (e.g., received at a photodiode of the pixel) and output ("generate") a pixel signal, which is an analog signal, based on the integrated photocharges.

SUMMARY

The inventive concepts provide methods of manufacturing an image sensor including a semiconductor chip including a plurality of pixels and a semiconductor chip including a signal processing circuit and a computing system configured to manufacture the image sensor.

According to some example embodiments, a method of manufacturing an image sensor, where the image sensor may include a first semiconductor chip and a second semiconductor chip, the first semiconductor chip may include a plurality of pixels, and the second semiconductor chip may include a signal processing circuit, may include receiving first manufacturing data associated with a design of the first semiconductor chip, receiving second manufacturing data associated with a design of the second semiconductor chip, processing the first manufacturing data and the second manufacturing data to determine a predicted capacitance and a predicted resistance of a pixel signal transmission line to which a pixel signal generated by each pixel of the plurality of pixels is transmitted, the predicted capacitance and the predicted resistance corresponding to position information associated with each pixel of the plurality of pixels, determining predicted characteristics of the image sensor based on the predicted capacitance and the predicted resistance, and electrically connecting the first semiconductor chip and the second semiconductor chip to form the image sensor based on a determination that the predicted characteristics of the image sensor resulting from the electrical connecting of the first semiconductor chip and the second semiconductor chip at least meet a particular set of one or more target values.

According to some example embodiments, a method of manufacturing an image sensor, where the image sensor may include a first semiconductor chip and a second semiconductor chip, the first semiconductor chip may include a plurality of pixels, and the second semiconductor chip may include a signal processing circuit, may include receiving first manufacturing data associated with a design of the first semiconductor chip, receiving second manufacturing data associated with a design of the second semiconductor chip, processing the first manufacturing data and the second manufacturing data to determine a predicted capacitance and a predicted resistance of a pixel signal transmission line to which a pixel signal generated by each pixel of the plurality of pixels is transmitted, determining predicted characteristics of the image sensor based on the predicted capacitance and the predicted resistance, and selectively mounting the first semiconductor chip on the second semiconductor chip based on the predicted characteristics of the image sensor.

According to some example embodiments, a computing system configured to manufacture an image sensor, where the image sensor may include a first semiconductor chip and a second semiconductor chip, may include a memory configured to store a program of instructions, and a processor. The processor may be configured to execute the program of instructions to receive manufacturing data associated with a design of each semiconductor chip of the first semiconductor chip and the second semiconductor chip, the first semiconductor chip including a plurality of pixels, the second semiconductor chip including a signal processing circuit, process the manufacturing data to determine a predicted capacitance and a predicted resistance of a pixel signal transmission line to which a pixel signal generated by each pixel of the plurality of pixels is transmitted, the predicted capacitance and the predicted resistance corresponding to position information associated with each pixel of the plurality of pixels, determine predicted characteristics of the image sensor based on the predicted capacitance and the predicted resistance.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EMBODIMENTS

Figure 1:
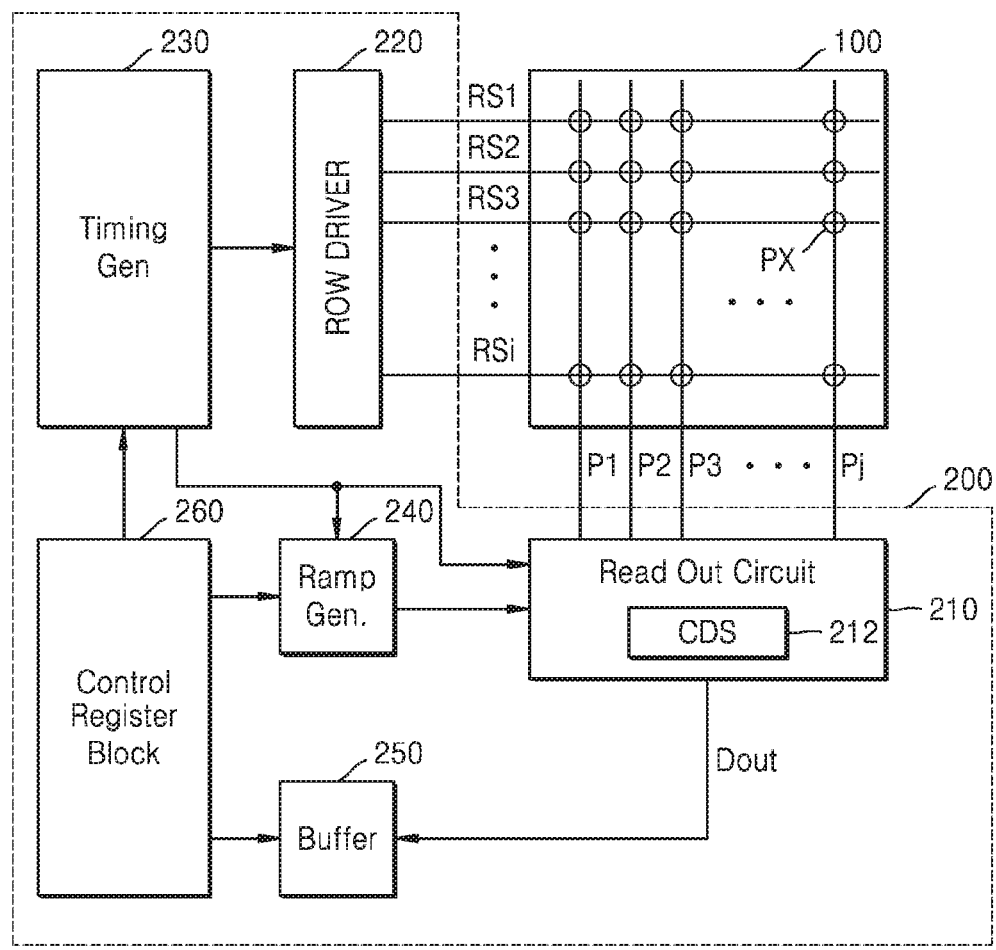
FIG. 1 is a block diagram of an image sensor according to some example embodiments.

FIG. 1 is a block diagram of an image sensor 10 according to some example embodiments.

Referring to FIG. 1, the image sensor 10 may include a pixel array 100 and a signal processing block 200. The pixel array 100 may include a plurality of pixels PX. The signal processing block 200 may be electrically connected to the pixel array 100 and may be configured to provide ("transmit") row signals RS1 to RSi from row driver 220 to the pixel array 100 (e.g., transmit a row signal to each pixel of the plurality of pixels PX in the pixel array 100 via separate, respective row signal transmission lines as shown in FIG. 1) or receive pixel signals P1 to Pj from the pixel array 100. The signal processing block 200 may include a series of signal processing circuits configured to receive a power signal or a control signal and performing operations in response to the received power signal or control signal. The signal processing block 200, which may be an instance of circuitry, may be a predefined function block and referred to as a digital block or intellectual property (IP) block including an analog-to-digital converter (ADC).

The pixel array 100 may include a plurality of pixels PX arranged in a matrix of i×j. Restated, the plurality of pixels PX may include a two-dimensional matrix of "i" pixels by "j" pixels. Here, each of i and j may be a natural number. Each of the pixels PX may be connected between a row line and a column line and output a pixel signal corresponding to incident light. In some example embodiments, each of the pixels PX may have a multi-layered structure including an organic photoelectric conversion unit or an inorganic photoelectric conversion unit. In some example embodiments, each of the pixels PX may have a multi-layered structure formed by stacking only organic photoelectric conversion units.

The signal processing block 200 may include a readout circuit 210, a row driver 220, a timing generator 230, a ramp signal generator 240, a buffer 250, and a control register block 260. The readout circuit 210 may include a correlated double sampling (CDS) circuit 212. The readout circuit 210 may receive the pixel signal P1 to Pj from the pixel array 100 and generate digital signal Dout.

The CDS circuit 212 may receive pixel signals P1 to Pj from a plurality of column lines embodied in the pixel array 100 and may perform a CDS operation on each of the received pixel signals P1 to Pj. Specifically, the CDS circuit 212 may doubly sample a noise level and a signal level corresponding to a pixel signal and output a difference level corresponding to a difference between the noise level and the signal level.

The readout circuit 210 may further include a comparator block and an analog-to-digital conversion (ADC) block. The comparator block may compare each of correlated double-sampled (CDS) pixel signals output by the CDS circuit 212 with a ramp signal output by the ramp signal generator 240 and output comparison signals. The ADC block may count comparison signals in response to a clock signal, convert each of a plurality of comparison signals output by the comparator block into digital data, and output a plurality of digital data to the buffer 250.

Even if light is not incident to the plurality of pixels PX included in the pixel array 100, the plurality of pixels PX may output pixel signals P1 to Pj, which are similar to pixel signals output by the plurality of pixels PX to which light is incident, due to a coupling with the row signals RS1 to RSi. The readout circuit 210 may output a digital signal Dout including noise. Accordingly, the readout circuit 210 may perform a readout operation in consideration of a settling time for which the pixel signals P1 to Pj are settled. A readout operation speed of the readout circuit 210 and a readout operation speed of the image sensor 10 may vary according to the settling time. The image sensor 10 according to some example embodiments may predict the settling time in advance and reduce a time taken to manufacture the image sensor 10.

The row driver 220 may drive at least one of a plurality of row lines of the pixel array 100 via the control of the timing generator 230. Specifically, the row driver 220 may provide row signals RS1 to RSi to the respective row lines of the pixel array 100. Here, a row signal may include a plurality of control signals for controlling a plurality of transistors included in a unit pixel.

The timing generator 230 may generate control signals for controlling an operation timing of the image sensor 10. Specifically, the timing generator 230 may control operations of the row driver 220 and the readout circuit 210 via the control of the control register block 260.

The ramp signal generator 240 may generate a ramp signal via the control of the timing generator 230. The ramp signal generator 240 may allow a voltage level of the ramp signal to change with a variation of current over time, by using a current-type digital-to-analog converter (DAC) or voltage-to current (V-I) converter. The ramp signal may be generated as a voltage having a single slope, provided to the readout circuit 210, and compared with a pixel signal output by the pixel array 100.

The control register block 260 may control operations of the timing generator 230, the ramp signal generator 240, and the buffer 250. The buffer 250 may store digital data, which is output by the readout circuit 210, in frame units. Thus, the buffer 250 may be referred to as a frame memory or a buffer memory. The buffer 250 may output digital data Dout, which is stored in frame units, to a digital signal processor (DSP).

In some embodiments, the image sensor 10 may further include an image signal processor (ISP). The ISP may perform a signal processing operation on raw data stored in the buffer 250 and output image data.

For example, the ISP may include a plurality of signal processing blocks configured to perform, on the raw data, signal processing operations, such as color interpolation, color correction, auto white balance, gamma correction, color saturation correction, format correction, bad pixel correction, hue correction, auto expose, auto focus, and phase defector auto focus (PDAF).

Figure 2:
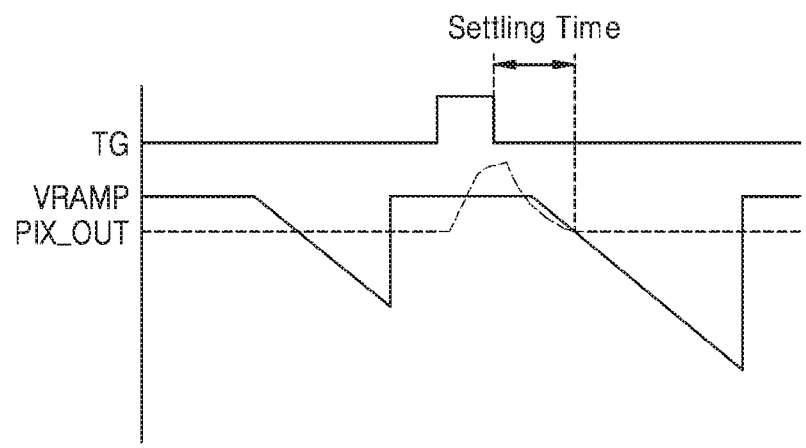
FIG. 2 is a graph showing waveforms of main signals when light is not incident to an image sensor according to some example embodiments.

FIG. 2 is a graph showing wave forms of main signals when light is not incident to an image sensor, including the image sensor 10 illustrated and described with reference to FIG. 1 above, according to some example embodiments.

Referring to FIGS. 1 and 2, even if light is not incident to a plurality of pixels PX included in a pixel array 100, a magnitude of a pixel signal PIX_OUT applied to a CDS circuit 212 may be changed due to a coupling with row signals RS1 to RSi (e.g., a transfer signal TG).

A settling time, which is a time ("period of elapsed time") taken to resettle the pixel signal PIX_OUT provided to the CDS circuit 212, may vary according to a pixel PX. The settling time may refer to a time duration between a time point at which a level of the transfer signal TG is changed and a time point at which the pixel signal PIX_OUT is resettled. Accordingly, the settling time may vary according to a capacitance and a resistance of a pixel signal transmission line to which the pixel signal PIX_OUT is transmitted. Also, the settling time may vary according to a capacitance and a resistance of a transfer signal transmission line through which a transfer signal TG is transmitted from the row driver 220 to the pixel PX. In some example embodiments, the settling time may vary according to a position of the pixel PX in the pixel array 100. The pixel signal transmission line may be a conductive line extending from an output terminal of the plurality of pixels to an input terminal of the signal processing circuit.

The comparator block of the readout circuit 210 may compare each of the CDS pixel signals output by the CDS circuit 212 with a ramp signal VRAMP output by the ramp signal generator 240 and output comparison signals.

If the comparator block of the readout circuit 210 starts the comparison operation without considering the settling time for a high-speed operation, a deviation between respective pixel signals may occur, thus causing degradation of pedestal performance and noise (e.g., random noise and fixed pattern noise) characteristics of the image sensor. In particular, when a semiconductor chip including a pixel array and a semiconductor chip including a signal processing block are separately manufactured and stacked, a through-silicon via (TSV) configured to connect semiconductor chips having different settling times may cause the image sensor to be susceptible to degradation of characteristics due to a resistance-capacitance (RC) delay, a variation, and interference. Restated, first semiconductor chip may be electrically connected to the second semiconductor chip through a through-silicon via (TSV).

Thus, in the image sensor 10 of some example embodiments, a settling time may be calculated, and the timing generator 230 may control the ramp signal generator 240 to generate the ramp signal VRAMP via the control of the control register block 260, based on the calculated settling time, in order to minimize degradation of characteristics due to an RC delay, a variation, and interference. As the settling time is shorter, an operating speed of the image sensor 10 may become higher, and thus the performance of the image sensor 10 may increase.

A method of manufacturing the image sensor 10 according to some example embodiments may include calculating a settling time based on manufacturing data of ("associated with") each of a first semiconductor chip including the plurality of pixels PX and a second semiconductor chip including the signal processing block 200, before the first semiconductor chip and the second semiconductor chip are stacked and bonded to each other. Thus, fixed pattern noise or a readout speed of the readout circuit 210 may be predicted in advance. If predicted characteristics of the image sensor 10 do not satisfy ("at least meet") a set of one or more target values, the manufacturing data of the first semiconductor chip or the second semiconductor chip may be changed, and a manufacture and/or electrically connecting of first and second semiconductor chips to form the image sensor 10 may be selectively implemented based on a determination of whether the predicted characteristics of the image sensor 10 resulting from the electrical connecting of the first semiconductor chip and the second semiconductor chip at least meet the set of one or more target values. Therefore, the method of manufacturing the image sensor 10 according to some example embodiments may reduce a time taken to manufacture an image sensor 10 and/or may result in the manufacture of an image sensor 10 having improved performance. In some example embodiments, characteristics of the image sensor 10 may include one or more characteristics of a characteristic of noise associated with the image sensor 10, a drive speed of the image sensor 10, power consumption of the image sensor 10, and sensitivity of the image sensor 10 to incident light. In some example embodiments, manufacturing data of a semiconductor chip is manufacturing data of a design of a semiconductor chip. For example, as described herein, manufacturing data of a first semiconductor chip may be manufacturing data of a design of the first semiconductor chip, and manufacturing data of a second semiconductor chip may be manufacturing data of a design of the second semiconductor chip. In some example embodiments, first manufacturing data and second manufacturing data corresponding to the TSV may be changed based on predicted characteristics of the image sensor.

Figure 3:
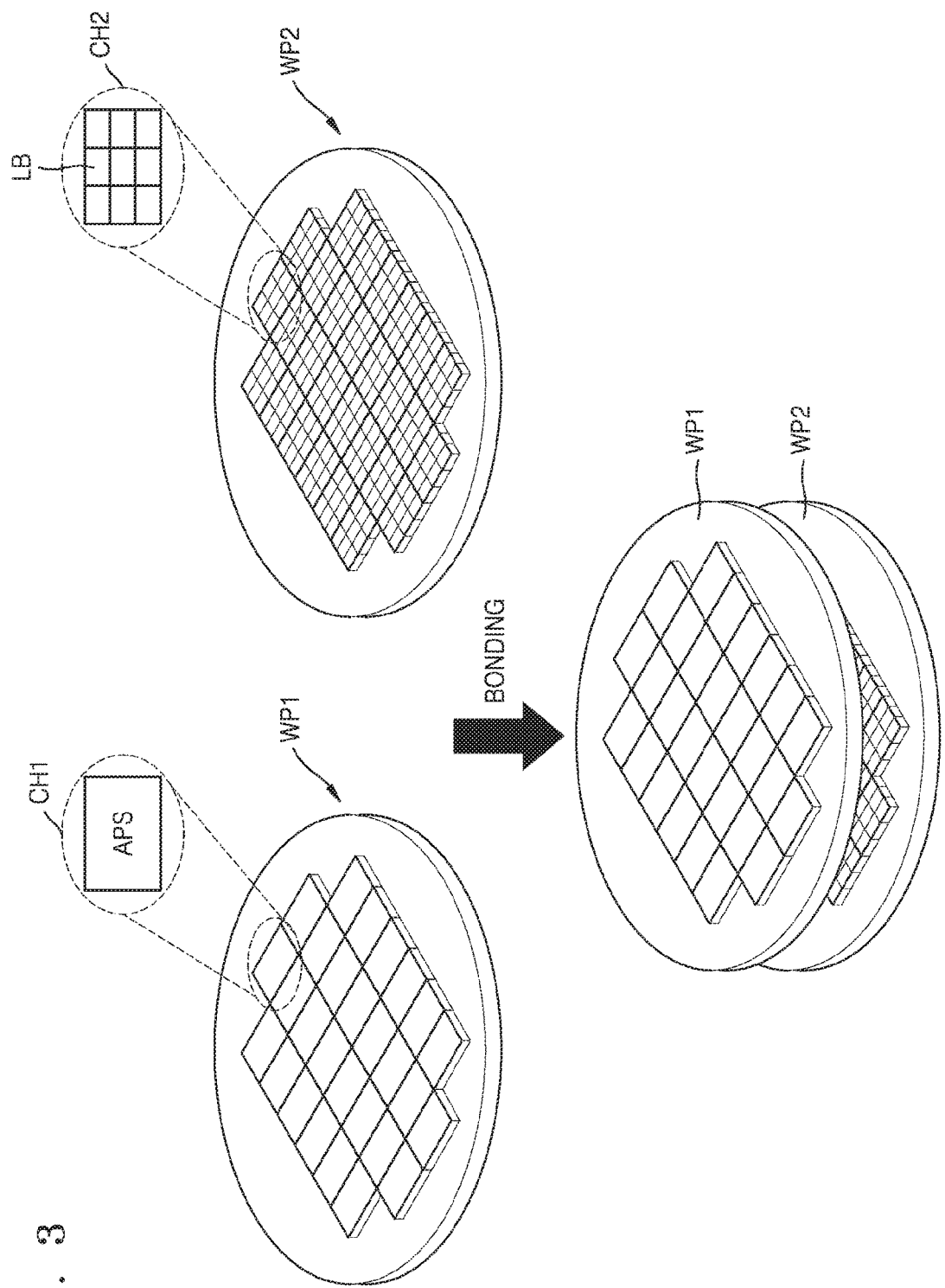
FIG. 3 shows a stack structure of two wafers according to some example embodiments.
Figure 4:
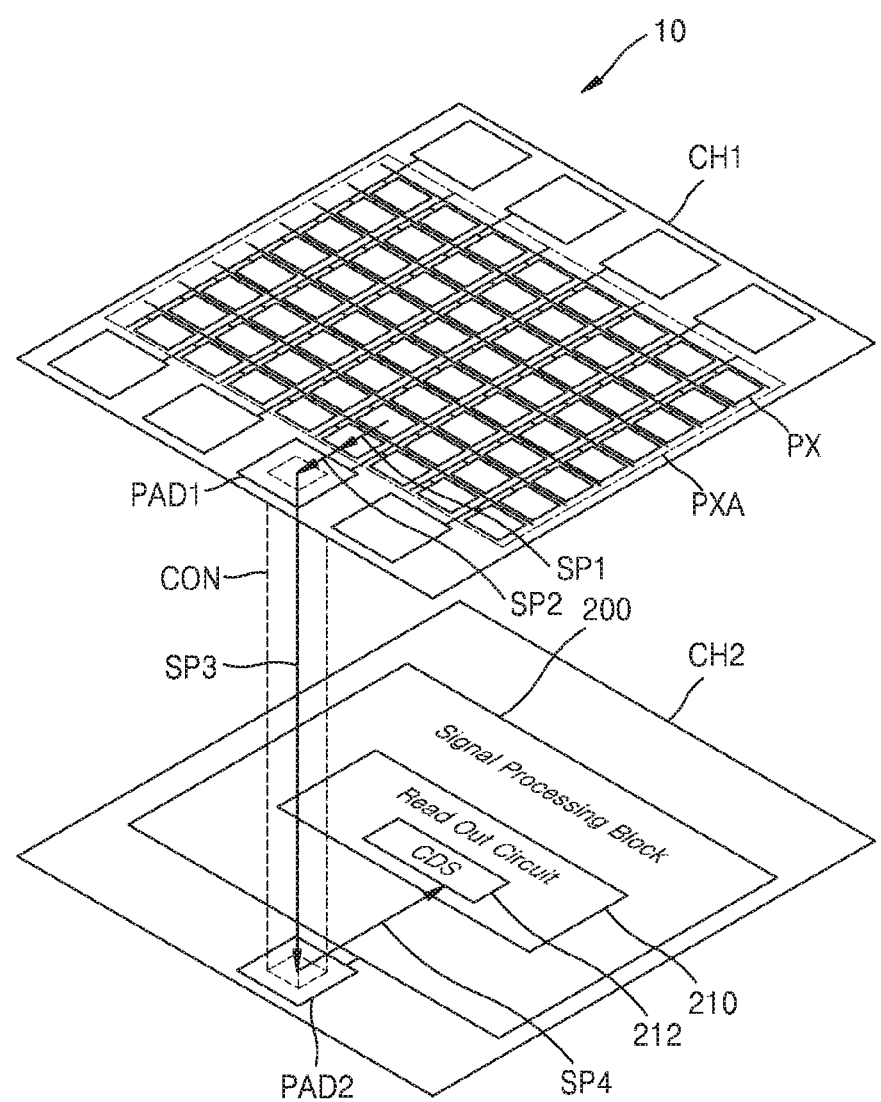
FIG. 4 is a circuit diagram of an image sensor according to some example embodiments.

FIG. 3 is a diagram showing a stack structure of two wafers WP1 and WP2 according to some example embodiments. FIG. 4 is a circuit diagram of an image sensor 10 according to some example embodiments.

Referring to FIG. 3, a plurality of first semiconductor chips CH1 may be 2-dimensionally arranged on one surface of a first wafer WP1. Each semiconductor chip of the first semiconductor chips CH1 may include an active pixel sensor APS, which may correspond to the pixel array (e.g., 100 in FIG. 1). Meanwhile, a plurality of second semiconductor chips CH2 may be 2-dimensionally arranged on one surface of the second wafer WP2. Each semiconductor chip LB of the second semiconductor chips CH2 may correspond to the signal processing block (e.g., 200 in FIG. 1).

The first wafer WP1 in which the first semiconductor chips CH1 are arranged and the second wafer WP2 in which the second semiconductor chips CH2 are arranged may be stacked and bonded to each other. Thus, a stacked wafer structure may be formed to at least partially form an image sensor. Specifically, the first and second wafers WP1 and WP2 may be bonded to each other based on using an adhesive film. The adhesive film may include an insulating adhesive material, for example, an epoxy resin or a silicone resin. As described above, according to some example embodiments, each semiconductor chip of the first semiconductor chips CH1 may include the pixel array, and each semiconductor chip of the second semiconductor chips CH2 may include the signal processing block. Thus, the pixel array and the signal processing block may be formed by using the two wafers WP1 and WP2.

Referring to FIGS. 3 and 4, the image sensor 10 may include a first semiconductor chip CH1 and a second semiconductor chip CH2. The first semiconductor chip CH1 may include a pixel array region PXA in which a plurality of pixels PX are arranged and a first pad PAD1 to be electrically connected to the second semiconductor chip CH2. The second semiconductor chip CH2 may include a signal processing block 200 and a second pad PAD2 to electrically connected to the first semiconductor chip CH1. In this case, the signal processing block 200 may correspond to the signal processing block 200 of FIG. 1. The row driver (e.g., 220 in FIG. 1) is included in the second semiconductor chip CH2, which is a lower chip, the inventive concepts is not limited thereto, and the row driver may be included in the first semiconductor chip CH1, which is an upper chip.

The first semiconductor chip CH1 may be stacked on the second semiconductor chip CH2. The first semiconductor chip CH1 may be bonded to the second semiconductor chip CH2 through an interconnection member CON, and the first semiconductor chip CH1 and the second semiconductor chip CH2 may constitute the image sensor 10. The interconnection member CON may include a conductive material. For example, the interconnection member CON may be a through-silicon via (TSV).

To manufacture ("form") the image sensor 10, a first layout, which is a layout of the first semiconductor chip CH1, and a second layout, which is a layout of the second semiconductor chip CH2, may be generated by a computing device. Specifically, the manufacture of the image sensor 10 may include separately providing ("generating") a layout ("design") of the pixel array region PXA and a layout of the signal processing block 200 instead of providing ("generating") the entire layout of the image sensor 10, manufacturing the first semiconductor chip CH1 and the second semiconductor chip CH2 based on the first layout and the second layout, respectively, and electrically connecting the first semiconductor chip CH1 and the second semiconductor chip CH2 to at least partially form the image sensor 10.

A method of manufacturing an image sensor according to some example embodiments may include stacking and bonding the first wafer WP1 and the second wafer WP2, that is, the first semiconductor chip CH1 and the second semiconductor chip CH2, and predicting the characteristics of the image sensor 10 in advance of the stacking and bonding based on processing manufacturing data of each semiconductor chip of the first semiconductor chip CH1 and the second semiconductor chip CH2. For example, the method may include processing first manufacturing data of the first semiconductor chip CH1 and second manufacturing data of the second semiconductor chip CH2, before the first semiconductor chip CH1 is electrically connected to the second semiconductor chip CH2. The manufacturing data may include not only a layout but also a circuit configuration, information indicating process operations corresponding to the layout, and characteristics models of devices included in the layout. At least some of a "layout," "circuit configuration," "arrangement," some combination thereof, or the like may be at least partially collectively referred to herein as a "design" that may be used to manufacture ("form") a semiconductor chip.

If the predicted characteristics of the image sensor 10 do not satisfy target values ("at least meet a set of one or more target values") of one or more characteristics of the image sensor 10, the manufacturing data of the first semiconductor chip CH1 or the second semiconductor chip CH2 may be changed, and the first wafer WP1 and the second wafer WP2 may be selectively manufactured anew based on the changed manufacturing data. Accordingly, when comparing with a method in which after the first semiconductor chip CH1 and the second semiconductor chip CH2 are stacked and bonded to each other, characteristics of the image sensor are measured and the first wafer WP1 and the second wafer WP2 are manufactured anew, the method of manufacturing the image sensor according to some example embodiments may reduce a time taken to manufacture the image sensor 10 and/or may result in the manufacture of an image sensor 10 having improved performance.

Figure 5:
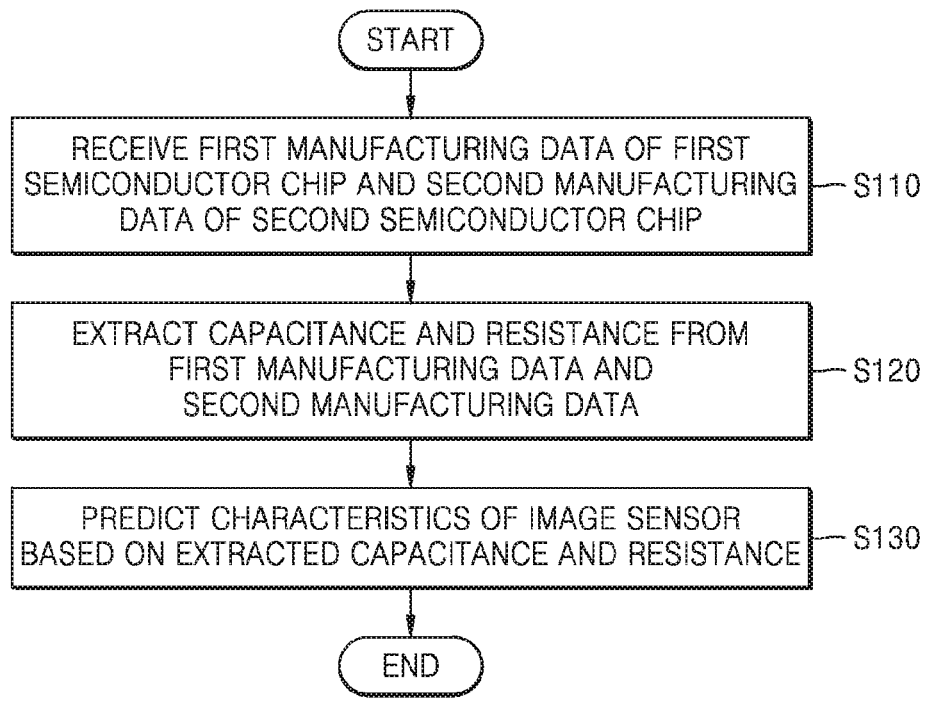
FIG. 5 is a flowchart of an operation of predicting characteristics of an image sensor according to some example embodiments.

FIG. 5 is a flowchart of an operation of predicting characteristics of an image sensor according to some example embodiments. A method of manufacturing the image sensor, according to some example embodiments, may include predicting the characteristics of the image sensor.

Referring to FIGS. 4 and 5, first manufacturing data of a first semiconductor chip CH1 including a plurality of pixels and second manufacturing data of a second semiconductor chip CH2 including a signal processing block 200 may be received (S110). The first manufacturing data and the second manufacturing data may include not only respective layouts of the first semiconductor chip CH1 and the second semiconductor chip CH2 but also circuit configurations, information of process operations corresponding to the layouts, and characteristics models of devices included in the layouts. Thus, the first manufacturing data of the first semiconductor chip CH1 may be first manufacturing data associated with a design of the first semiconductor chip CH1, and the second manufacturing data of the second semiconductor chip CH2 may be second manufacturing data associated with a design of the second semiconductor chip CH2.

The first manufacturing data may include information regarding arrangement of a pixel array region PXA including a pixel array region PXA including a plurality of pixels arranged in a matrix of i×j and a first pad PAD1 to be electrically connected to the second semiconductor chip CH2. Also, the first manufacturing data may include information regarding arrangement of each of devices included in the plurality of pixels PX of the pixel array region PXA. For example, a first layout included in the first manufacturing data may include arrangement of a gate line and an active region in which a photodiode and a plurality of transistors are formed. A second layout included in the second manufacturing data may indicate arrangement of the signal processing block 200 including a plurality of transistors.

A capacitance and a resistance may be extracted from the first manufacturing data and the second manufacturing data (S120). As referred to herein, the capacitance and the resistance may be referred to as a predicted capacitance and a predicted resistance, which may be associated with a design of the first semiconductor chip CH1 and/or a design of the second semiconductor chip CH2. In some example embodiments, the capacitance and the resistance may be a capacitance and a resistance of a pixel signal transmission line through which pixel signals (e.g., P1 to Pj of FIG. 1) generated by the plurality of pixels PX are transmitted to a readout circuit (e.g., 210 in FIG. 1), such that the signal processing circuit includes a readout circuit configured to receive a separate pixel signal from each pixel of the plurality of pixels PX and the readout circuit is further configured to generate a digital signal. Since a settling time of a pixel signal transmitted to the readout circuit varies according to the capacitance and the resistance of the pixel signal transmission line, a readout operation of the readout circuit may be controlled based on the settling time of the pixel signal. The capacitance and the resistance of the pixel signal transmission line may vary according to position information of a pixel. Accordingly, the capacitance and the resistance of the pixel signal transmission line corresponding to the position information of the pixel may be expressed by a formula. For example, when the plurality of pixels PX are arranged in a matrix of i×j in a pixel array, the capacitance and the resistance of the pixel signal transmission line, which vary according to values i and j, may be expressed by a formula (restated, the capacitance and the resistance each vary according to values of "i" and "j", and the values i and j may be substituted into the formula to obtain the capacitance and the resistance of the pixel signal transmission line. A method of extracting the capacitance and the resistance will be described below with reference to FIG. 8.

Characteristics of the image sensor may be predicted (e.g., predicted characteristics of the image sensor to be formed based on the electrical connecting of the first semiconductor chip CH1 and the second semiconductor chip CH2 may be determined) based on the extracted ("predicted") capacitance and ("predicted") resistance of the pixel transmission line (S130). For example, the settling time of the pixel signal may be predicted based on the extracted capacitance and resistance of the pixel signal transmission line. Restated, in some example embodiments determining the predicted characteristics includes calculating a settling time of the pixel signal. Thus, a speed at which the readout circuit of the image sensor reads out the pixel signal may be predicted. In some example embodiments, the settling time of the pixel signal or the speed at which the readout circuit of the image sensor reads out the pixel signal may be obtained ("determined") by obtaining a settling time of a pixel signal or a speed at which the readout circuit reads out the pixel signal, which corresponds to each of the pixels PX, and calculating the average settling time of the pixel signal or the average speed at which the readout circuit reads out the pixel signal, which may be applied to all the pixels PX.

A settling time of a pixel signal may be predicted in additional consideration of a capacitance and a resistance of a transfer signal transmission line through which a transfer signal is transmitted from a row driver to each of the plurality of pixels PX and a capacitance and a resistance of an internal line of a CDS circuit 212.

Figure 6:
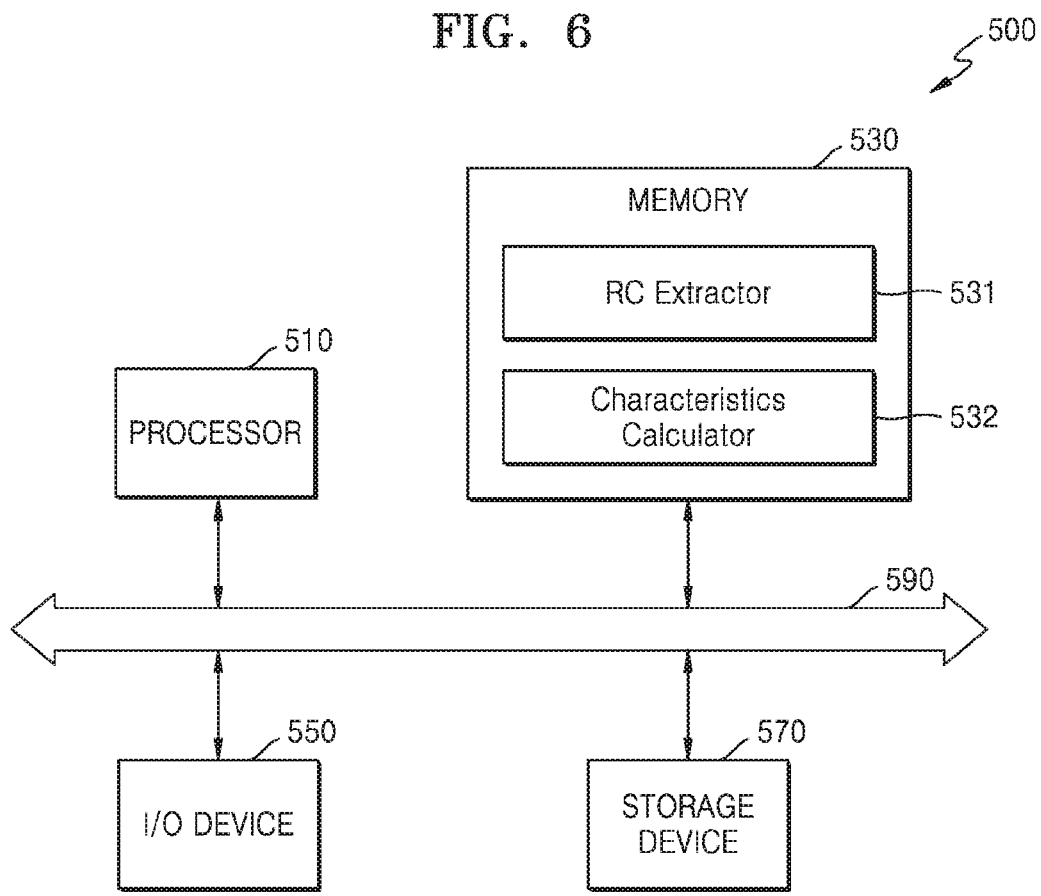
FIG. 6 is a block diagram of a computing system configured to predict characteristics of an image sensor according to some example embodiments.

FIG. 6 is a block diagram of a computing system 500 configured to predict characteristics of an image sensor according to some example embodiments.

Referring to FIG. 6, the computing system (hereinafter, referred to as a 'characteristics prediction system') 500 configured to predict characteristics of the image sensor may include a processor 510, a memory 530, an input/output (I/O) device 550, a storage device 570, and a bus 590. The characteristics prediction system 500 may perform an operation of predicting characteristics of the image sensor, which may include operations S110 to S130 of FIG. 4. In some example embodiments, although the characteristics prediction system 500 may be provided as a dedicated device configured to predict characteristics of the image sensor, the characteristics prediction system 500 may be a computer configured to drive various simulation tools or design tools.

The processor 510 may be configured to execute commands for performing at least one of various operations for predicting the characteristics of the image sensor. Restated, the memory 530 may store a program of instructions, and the processor 510 may execute the program of instructions to perform at least one of various operations for predicting the characteristics of the image sensor (including one or more of the operations illustrated in FIGS. 5, 8, and 10). The processor 510 may communicate with the memory 530, the I/O device 550, and the storage device 570 through the bus 590. The processor 510 may drive a resistance-capacitance (RC) extractor 531 and a characteristics calculator 532, which are loaded in the memory 530, and perform an operation for predicting the characteristics of the image sensor.

The memory 530 may store the RC extractor 531 and the characteristics calculator 532. The RC extractor 531 and the characteristics calculator 532 may be loaded from the storage device 570 into the memory 530. The memory 530 may be a volatile memory, such as static random access memory (SRAM) or dynamic RAM (DRAM), or a non-volatile memory, such as phase-change RAM (PRAM), magnetic RAM (MRAM), resistive RAM (ReRAM), ferroelectric RAM (FRAM), or NOR flash memory.

The RC extractor 531 may be, for example, a program including a plurality of commands for extracting the capacitance and the resistance in operation S120 of FIG. 4. The characteristics calculator 532 may be, for example, a program including a plurality of commands for predicting the characteristics of the image sensor in operation S130 of FIG. 4.

The I/O device 550 may control user inputs and outputs from user interface devices. For example, the I/O device 550 may include an input device, such as a keyboard, a mouse, and a touch pad, and receive input data that defines an integrated circuit (IC). For example, the I/O device 550 may include an output device, such as a display and a speaker, and display a result of prediction of the characteristics of the image sensor. In some example embodiments, the I/O device 550 may control one or more manufacturing devices, including one or more devices configured to electrically connect first and second semiconductor chips, such that the computing system 500 may be configured to implement at least a portion of the manufacturing of an image sensor, including the electrical connecting of first and second semiconductor chips.

The storage device 570 may store various data related to the RC extractor 531 and the characteristics calculator 532. In some example embodiments, the storage device 570 may store a first layout of a first semiconductor chip (e.g., CH1 in FIG. 3) and a second layout of a second semiconductor chip (e.g., CH2 in FIG. 3). The storage device 570 may include a memory card (e.g., a multimedia card (MMC), an embedded MMC (eMMC), secure digital (SD), or MicroSD), a solid-state drive (SSD), and/or a hard disk drive (HDD).

Figure 7:
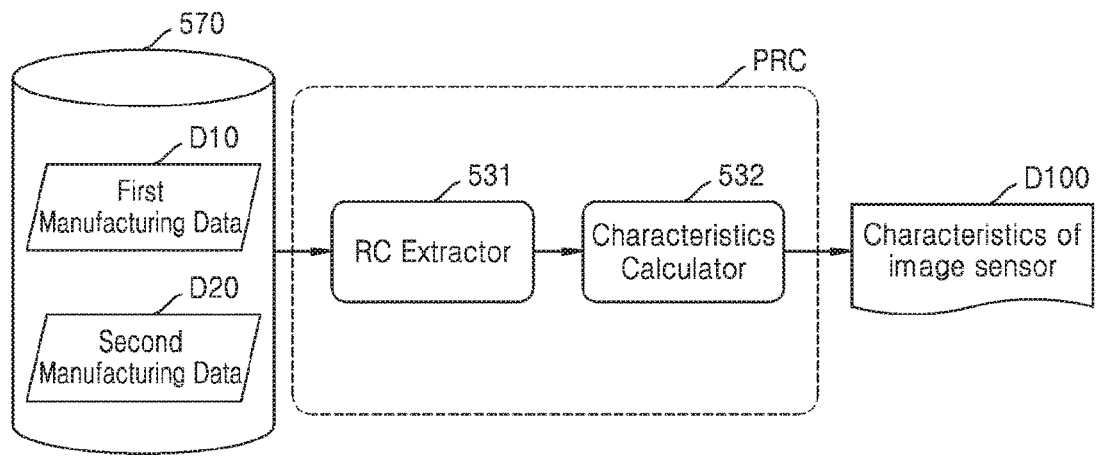
FIG. 7 shows an example of a program stored in a memory of FIG. 6, according to some example embodiments.

FIG. 7 shows an example of a program stored in the memory 530 of FIG. 6, according to some example embodiments.

Referring to FIGS. 6 and 7, the program stored in the memory 530 may include a plurality of procedures PRC (also referred to herein as a plurality of programs of instructions). Here, the procedures PRC may refer to a series of commands for performing specific tasks. The procedures PRC may be referred to as functions, routines, subroutines, or subprograms. According to some example embodiments, the procedures PRC may include an RC extractor 531 and a characteristics calculator 532. Herein, when the processor 510 of FIG. 6 performs operations by executing the procedures PRC, it may also be inferred that the procedures PRC perform the operations.

First manufacturing data D10 and second manufacturing data D20 may be stored in the storage device 570. The first manufacturing data D10 may include arrangement information of ("a design associated with") a first semiconductor chip including a plurality of pixels. The second manufacturing data D20 may include arrangement information of ("a design associated with") a second semiconductor chip including signal processing circuits configured to provide control signals to the plurality of pixels or process pixel signals output by the plurality of pixels. Although FIG. 7 illustrates an example in which the first manufacturing data D10 and the second manufacturing data D20 are stored in one storage device 570, the inventive concepts is not limited thereto, and the first manufacturing data D10 and the second manufacturing data D20 may be stored in different storage devices.

The RC extractor 531 may extract a ("predicted") capacitance and a ("predicted") resistance of a pixel signal transmission line through which pixel signals generated by the plurality of pixels are transmitted to a readout circuit, from the first manufacturing data D10 and the second manufacturing data D20. In some example embodiments, a formula for the capacitance and the resistance of the pixel signal transmission line corresponding to position information of a pixel may be stored in the storage device 570. For example, when the plurality of pixels PX are arranged in in a matrix of i×j in a pixel array, a capacitance and a resistance of the pixel signal transmission line, which vary according to values i and j, may be expressed by a formula, and the formula may be stored in the storage device 570. The RC extractor 531 may substitute the values i and j into the formula to obtain the capacitance and the resistance of the pixel signal transmission line.

The pixel signal transmission line may be divided into a plurality of sub-paths, a capacitance and a resistance of each of the plurality of sub-pixels may be extracted, and the total capacitance and the total resistance of the pixel signal transmission line may be extracted. Position information of the plurality of pixels PX may be respectively different, and the capacitance and the resistance of the pixel signal transmission line may vary according to a position of each of the plurality of pixels PX. A method of extracting the capacitance and the resistance of the pixel signal transmission line after the pixel signal transmission line is divided into the plurality of sub-paths will be described below with reference to FIG. 9. Restated, determining a predicted capacitance and a predicted resistance may include dividing a path into a plurality of sub-paths and determining a sub-capacitance and a sub-resistance of each sub-path of the plurality of sub-paths, the path configured to transmit the separate pixel signal generated by each pixel of the plurality of pixels to the readout circuit.

The characteristics calculator 532 may calculate and predict characteristics D100 of the image sensor based on the capacitance and the resistance of the pixel signal transmission line, which are extracted by the RC extractor 531. In some example embodiments, since the settling time of the pixel signal varies according to the capacitance and the resistance of the pixel signal transmission line, the characteristics calculator 532 may calculate a predicted settling time of the pixel signal and calculate a maximum speed at which the image sensor may satisfy main image characteristics and efficiently operate.

Figure 8:
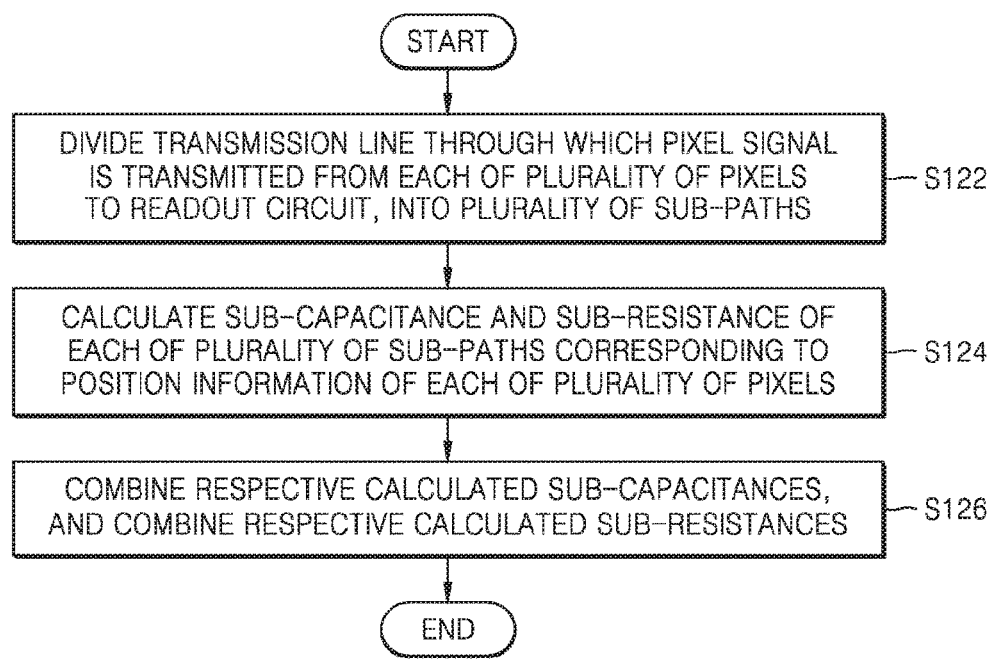
FIG. 8 is a flowchart of an operation of predicting characteristics of an image sensor according to some example embodiments.

FIG. 8 is a flowchart of an operation (operation S120 of FIG. 5) of predicting characteristics of an image sensor according to some example embodiments.

Referring to FIGS. 4 and 8, a pixel signal transmission line through which a pixel signal is transmitted from each of a plurality of pixels to a readout circuit 210 may be divided into a plurality of sub-paths (S122). The pixel signal transmission line through which the pixel signal is transmitted from each of the plurality of pixels to the readout circuit 210 may be divided into the plurality of sub-paths in various manners. A method of dividing the pixel signal transmission line into the plurality of sub-paths, according to some example embodiments, will be described below with reference to FIG. 8.

Since the position information of the respective pixels is different, the plurality of sub-paths may vary according to a position of each of the plurality of pixels. A sub-capacitance and a sub-resistance of each of the plurality of sub-paths (e.g., a predicted sub-capacitance and a predicted sub-resistance of each sub-path of the plurality of sub-paths), which correspond to the position information of each of the plurality of pixels, may be calculated (S124). For example, when the plurality of pixels are arranged in a matrix of i×j, the sub-capacitance and the sub-resistance of each of the plurality of sub-paths may be given by a numerical formula with values i and j as parameters. An RC extractor (e.g., 531 in FIG. 6) may substitute the values i and j into the numerical formula and calculate a sub-capacitance and a sub-resistance of each of the plurality of sub-paths corresponding respectively to the plurality of pixels.

After the sub-capacitance the sub-resistance of each of the plurality of sub-paths are calculated, a capacitance of the pixel signal transmission line may be extracted by combining a plurality of sub-capacitances, and a resistance of the pixel signal transmission line may be extracted by synthesizing a plurality of sub-resistances (S126). Restated, in some example embodiments a predicted capacitance and a predicted resistance of a pixel signal transmission line to which a pixel signal generated by each pixel of the plurality of pixels is transmitted may be determined, where the predicted capacitance and the predicted resistance correspond to position information associated with each pixel of the plurality of pixels. In some example embodiments, determining the predicted capacitance and the predicted resistance includes dividing the pixel signal transmission line into a plurality of sub-paths, determining a sub-capacitance and a sub-resistance of each sub-path of the plurality of sub-paths, and combining respective sub-capacitances of the plurality of sub-paths to determine the predicted capacitance and combining respective sub-resistances of the plurality of sub-paths to determine the predicted resistance.

Figure 9:
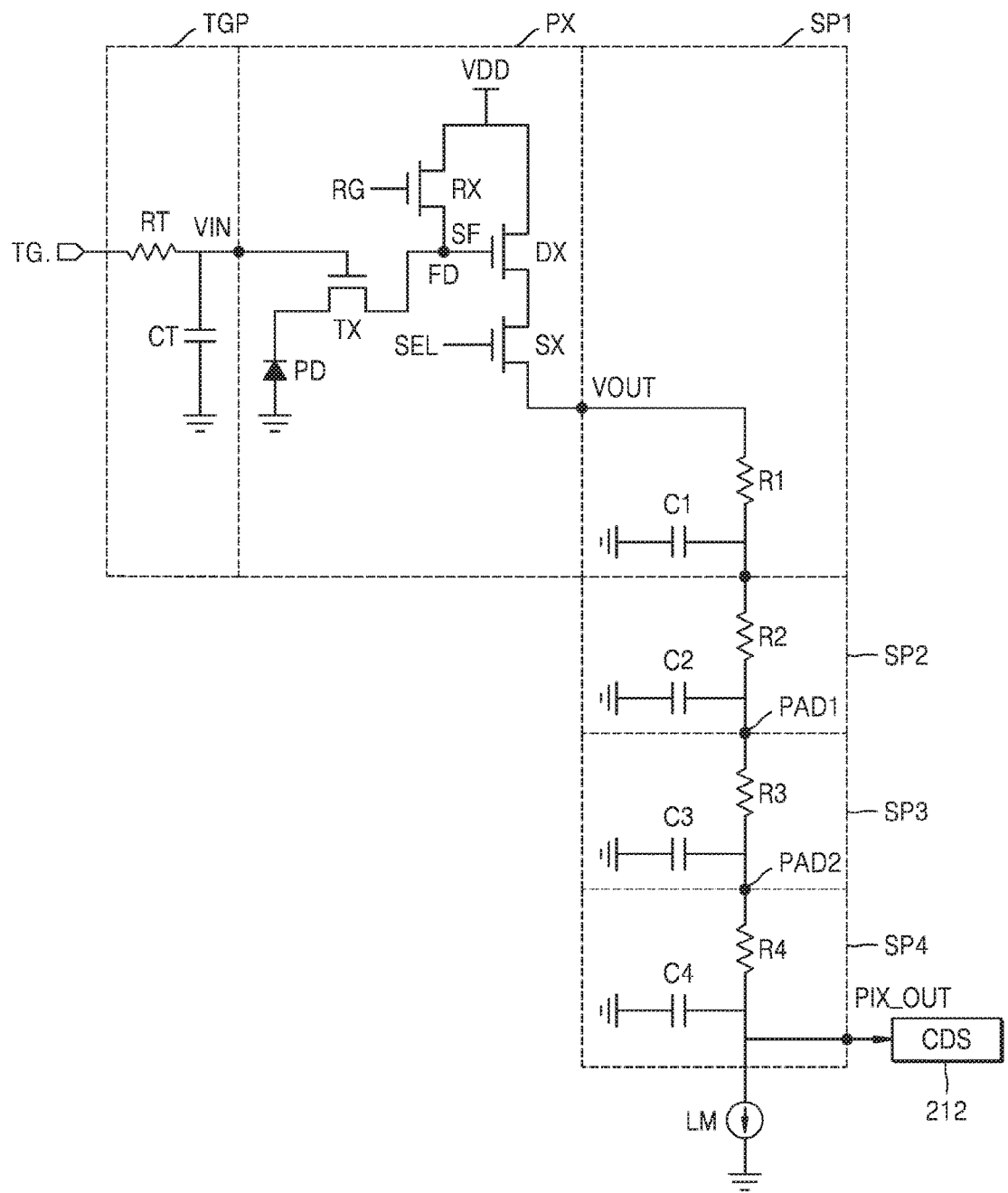
FIG. 9 is a circuit diagram of a plurality of sub-paths connected to a pixel of an image sensor according to some example embodiments.

FIG. 9 is a circuit diagram of a plurality of sub-paths connected to a pixel PX of an image sensor according to some example embodiments. The circuit diagram may be a design of one or more circuits of an image sensor.

Referring to FIGS. 4 and 9, the pixel PX may include a photodiode PD, a transfer transistor TX, a reset transistor RX, a drive transistor DX, and a select transistor SX. The pixel PX according to some example embodiments may correspond to the pixel PX of FIG. 1.

The pixel PX may receive a row signal from the outside, for example, the row driver (refer to 220 in FIG. 1), where the row driver may be configured to transmit a row signal to each pixel of a plurality of pixels PX. The row signal may be received via a row signal transmission line. The row signal may include a reset signal RG applied to a gate of the reset transistor RX, a transfer signal TG applied to a gate of the transfer transistor TX, and a selection signal SEL applied to a gate of the select transistor SX. Also, the pixel PX may generate a pixel signal VOUT according to the intensity of sensed light and output the generated pixel signal VOUT to the outside. Determining the predicted characteristics of the image sensor may include determining the predicted characteristics of the image sensor based on a resistance and a capacitance of a row signal transmission line, where the row signal transmission line is configured to transmit a row signal (e.g., RS1 to RSi) from the row driver 220 to a pixel of the plurality of pixels PX.

The photodiode PD may receive light and generate photocharges and be referred to as a photodetector. Here, the photodiode PD may include at least one of a photogate, a pinned photodiode (PPD), and a combination thereof. The transfer transistor TX may transfer photocharges generated by the photodiode PD to a floating diffusion region FD. Also, the reset transistor RX may periodically reset charges stored in the floating diffusion region FD. The drive transistor DX may serve as a source follower buffer amplifier and buffer a signal corresponding to charges SF charged in the floating diffusion region FD. The select transistor SX may perform switching and addressing operations to select the pixel PX.

FIG. 9 illustrates a 4T-type pixel PX including one photodiode PD and four MOS transistors TX, RX, DX, and SX, but the inventive concepts are not limited thereto. Example embodiments of the inventive concepts may be applied to all circuits including a photodiode PD and at least three transistors including a drive transistor DX and a select transistor SX.

In some example embodiments, a pixel signal transmission line through which a pixel signal PIX_OUT is transmitted from a pixel PX to a CDS circuit 212 of a readout circuit 210 (e.g., from a spot at which a pixel signal VOUT is output to a spot at which the pixel signal PIX_OUT is applied to the CDS circuit 212) may be divided into a plurality of sub-paths SP1 to SP4.

For example, a pixel signal transmission line to which a pixel signal VOUT output by the pixel PX is transmitted in a pixel array region PXA may constitute a first sub-path SP1. The first sub-path SP1 may constitute an equivalent circuit including a first resistor R1 and a first capacitor C1. A portion of the pixel signal transmission line from the pixel array region PXA to a first pad PAD1 may constitute a second sub-path SP2, a portion of the pixel signal transmission line from the first pad PAD1 to a second pad PAD2 may constitute a third sub-path SP3, and a portion of the pixel signal transmission line from the second pad PAD2 to the CDS circuit 212 may constitute a fourth sub-path SP4. In this case, the third sub-path SP3 may be provided by an interconnection member (e.g., a TSV) configured to electrically connect a first semiconductor chip CH1 and a second semiconductor chip CH2.

The second sub-path SP2 may constitute an equivalent circuit including a second resistor R2 and a second capacitor C2, and the third sub-path SP3 may constitute an equivalent circuit including a third resistor R3 and a third capacitor C3. The fourth sub-path SP4 may constitute an equivalent circuit including a fourth resistor R4 and a fourth capacitor C4.

Resistances of the first to fourth resistors R1 to R4 and capacitances of the first to fourth capacitors C1 to C4 may vary according to a position in which the pixel PX is arranged in the pixel array region PXA. For example, when the pixels PX are arranged in a matrix of i×j, the resistances of the first to fourth resistors R1 to R4 and the capacitances of the first to fourth capacitors C1 to C4 may vary according to a value i or a value j. The RC extractor 531 of FIG. 7 may extract the resistances of the first to fourth resistors R1 to R4 and the capacitances of the first to fourth capacitors C1 to C4 and extract the total resistance and capacitance of the pixel signal transmission line corresponding to position information of the pixel PX based on the extracted resistances of the first to fourth resistors R1 to R4 and the extracted capacitances of the first to fourth capacitors C1 to C4.

FIG. 9 illustrates a case in which the pixel signal transmission line through which the pixel signal VOUT is transmitted from the pixel PX to the CDS circuit 212 of the readout circuit 210 is divided into four sub-paths, but the inventive concepts is not limited thereto. The pixel signal transmission line may be divided into a plurality of sub-paths in consideration of structural characteristics of the pixel signal transmission line.

A transfer signal transmission line TGP through which a transfer signal TG is transmitted from a row driver (e.g., 220 in FIG. 1) to the pixel array region PXA including a plurality of pixels may constitute an equivalent circuit including a resistor RT and a capacitor CT. A transfer signal VIN transmitted through the transfer signal transmission line TGP to the pixel PX may have a different waveform from the transfer signal TG output by the row driver. Accordingly, the resistor RT and the capacitor CT of the transfer signal transmission line TGP may also affect a settling time of the pixel signal PIX_OUT applied to the CDS circuit 212. Also, a signal transmission line included in the pixel PX may constitute an equivalent circuit including a resistor and a capacitor, and a line formed in the CDS circuit 212 may constitute an equivalent circuit including a resistor and a capacitor. Accordingly, the RC extractor 531 of FIG. 6 may extract a resistance of an equivalent resistor and a capacitance of an equivalent capacitor in each of the transfer signal transmission line TGP, the signal transmission line included in the pixel PX, and the line formed in the CDS circuit 212. Restated, in some example embodiments determining the predicted characteristics of the image sensor includes determining predicted characteristics of the image sensor based on an equivalent resistance and an equivalent capacitance of the CDS circuit 212.

Figure 10:
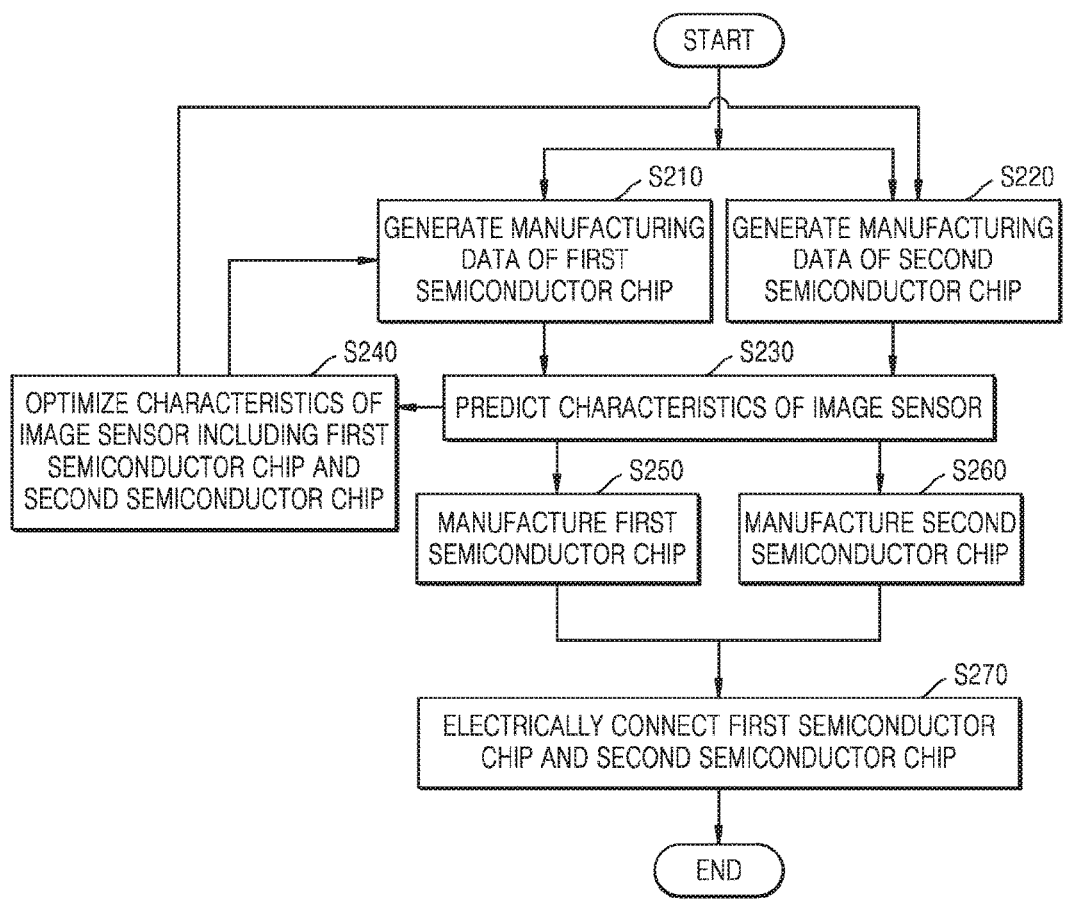
FIG. 10 is a flowchart of a method of manufacturing an image sensor according to some example embodiments.

FIG. 10 is a flowchart of a method of manufacturing an image sensor according to some example embodiments. The method of FIG. 10 may be performed after operation S130 of FIG. 5.

Referring to FIG. 10, manufacturing data of a first semiconductor chip may be generated (S210), and manufacturing data of a second semiconductor chip may be generated (S220). Manufacturing data may include a layout of a semiconductor chip, a circuit configuration, information of process operations corresponding to the layout, and characteristics models of devices included in the layout. As referred to above, manufacturing data of a first semiconductor chip may be manufacturing data associated with a design of a first semiconductor chip, and manufacturing data of a second semiconductor chip may be manufacturing data associated with a design of a second semiconductor chip.

The first semiconductor chip may include a plurality of pixels, and the second semiconductor chip may include signal processing circuits configured to process pixel signals generated by the plurality of pixels. The manufacturing data of the first semiconductor chip and the second semiconductor chip may be generated to optimize characteristics of each of the first and second semiconductor chips. However, even if the manufacturing data of the first semiconductor chip and the second semiconductor chip optimizes the characteristics of each of the first semiconductor chip and the second semiconductor chip, it may not be inferred that characteristics of the image sensor in which the first semiconductor chip is electrically connected to the second semiconductor chip are optimized.

The characteristics of the image sensor may be predicted (e.g., predicted characteristics of the image sensor may be determined) based on the manufacturing data of the first semiconductor chip and the second semiconductor chip (S230). A method of predicting the characteristics of the image sensor may be performed with reference to the flowcharts of FIGS. 5 and 8. For example, the total capacitance and resistance of a pixel signal transmission line to which a pixel signal generated by each of the plurality of pixels may be extracted (e.g., predicted) based on the manufacturing data of the first semiconductor chip and the second semiconductor chip, and main image characteristics of the image sensor may be predicted based on the extracted capacitance and resistance. The predicted main image characteristics of the image sensor may include a settling time, a maximum operating speed, sensitivity, interference, and noise (e.g., random pattern noise or fixed pattern noise). Restated, determining predicted characteristics of the image sensor may include calculating the predicted characteristics of the image sensor based on at least one of a variation between pixel signals, interference, sensitivity, and noise The predicted characteristics of the image sensor may be compared with target characteristics of the image sensor (e.g., a particular set of one or more target values). If the predicted characteristics of the image sensor do not satisfy target values (e.g., at least meet a particular set of one or more target values of said characteristics of the image sensor), an operation of optimizing characteristics of the image sensor including the first semiconductor chip and the second semiconductor chip may be performed (S240). That is, the characteristics of the image sensor may be optimized by changing at least one of first manufacturing data and second manufacturing data. Restated, in some example embodiments, operation S240 may include changing the first manufacturing data to generate changed first manufacturing data based on the predicted characteristics of the image sensor and/or changing the second manufacturing data to generate changed second manufacturing data based on the predicted characteristics of the image sensor. For example, in operation S240, a layout of the first semiconductor chip may be changed, a circuit configuration of the first semiconductor chip may be changed, a layout of the second semiconductor chip may be changed, or a circuit configuration of the second semiconductor chip may be changed. In another example, a process operation related with manufacturing the first semiconductor chip or the second semiconductor chip may be changed, or characteristics of devices included in the first semiconductor chip or the second semiconductor chip may be changed. Such an operation S240 may be selectively performed instead of operations S250-S270 based on a determination that the predicted characteristics of the image sensor do not satisfy the particular set of one or more target values.

In some example embodiments, if a settling time of the pixel signal is longer than a target value, the first manufacturing data may be changed to reduce the total resistance or the total capacitance of the pixel signal transmission line to which the pixel signal is transmitted. For example, the total resistance or the total capacitance of the pixel signal transmission line may be changed by changing a layout of at least one of the first to third sub-paths SP1 to SP3 shown in FIG. 8. However, the inventive concepts are not limited thereto. For example, a layout of a transfer signal transmission line through which a transfer signal TG is transmitted from a row driver to a pixel array may be changed, or characteristics of devices included in the pixel PX may be changed.

In some example embodiments, the second manufacturing data may be changed to reduce the total resistance or the total capacitance of the pixel signal transmission line to which the pixel signal is transmitted. For example, the total resistance or the total capacitance of the pixel signal transmission line may be changed by changing the layout of at least one of the third and fourth sub-paths SP3 and SP4 shown in FIG. 8. However, the inventive concepts are not limited thereto, and a layout of the CDS circuit 212 may be changed.

After at least one of the first manufacturing data and the second manufacturing data is changed, characteristics of the image may be predicted again based on the re-changed manufacturing data. Re-stated, in some example embodiments, operations S210 and S220 that are performed subsequently to performing operation S240 at least once includes determining updated predicted characteristics of the image sensor based on changed first manufacturing data (changed at S240) and/or changed second manufacturing data (changed at S240). If the re-predicted characteristics of the image do not reach target values, at least one of the first manufacturing data and the second manufacturing data may be changed again (e.g., S240). In contrast, if the predicted characteristics of the image sensor reach the target values, (e.g., a determination is made that the predicted characteristics of the image sensor resulting from the electrical connecting of the first semiconductor chip and the second semiconductor chip at least meet a particular set of one or more target values), the first semiconductor chip may be manufactured based on the first manufacturing data (S250), the second semiconductor chip may be manufactured based on the second manufacturing data (S260), and the manufactured first semiconductor chip may be electrically connected to the manufactured second semiconductor chip (S270), thereby manufacturing ("forming") the image sensor. In this case, the first semiconductor chip may be mounted on the second semiconductor chip. Restated, in some example embodiments electrically connecting the first semiconductor chip and the second semiconductor chip includes mounting the first semiconductor chip on the second semiconductor chip. The performance of operations S250-S270 instead of operation S240 may be referred to as "selectively" performing one or more of operations S250-S270 (e.g., selectively electrically connecting the first semiconductor chip and the second semiconductor chip to form the image sensor based on a determination that the predicted characteristics of the image sensor resulting from the electrical connecting of the first semiconductor chip and the second semiconductor chip at least meet a particular set of one or more target values). Mounting the first semiconductor chip on the second semiconductor chip may include selectively mounting the first semiconductor chip on the second semiconductor chip includes selectively mounting the first semiconductor chip on the second semiconductor chip based on a determination of whether the predicted characteristics of the image sensor at least meet one or more target values.

In a comparative example, after first and second semiconductor chips are manufactured, stacked, and bonded to each other, characteristics of an image sensor may be measured. When the measured characteristics do not reach target values (e.g., at least meet a particular set of one or more target values), first manufacturing data and second manufacturing data may be changed. When comparing with the comparative example, a method of manufacturing an image sensor according to some example embodiments may include predicting characteristics of an image sensor based on first manufacturing data and second manufacturing data, when a first semiconductor chip and a second semiconductor chip are not manufactured yet. Thus, a time taken to manufacture the image sensor may be reduced.

Figure 11:
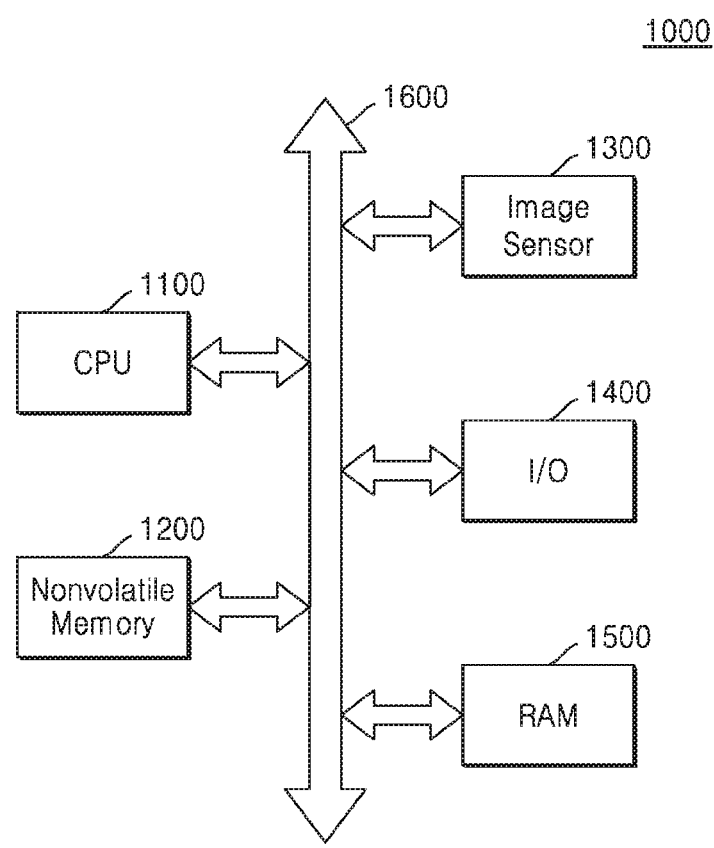
FIG. 11 is a block diagram of a system including an image sensor according to some example embodiments.

FIG. 11 is a block diagram of a system 1000 including an image sensor according to some example embodiments.

Referring to FIG. 11, the system 1000 may be any one of a computing system, a camera system, a scanner, a vehicle navigation, a video phone, a security system, or a motion detection system, which may image data.

As shown in FIG. 11, the system 1000 may include a central processing unit (CPU) (or a processor) 1100, a non-volatile memory 1200, an image sensor 1300, an I/O device 1400, and a random access memory (RAM) 1500. The CPU 1100 may communicate with the non-volatile memory 1200, the image sensor 1300, the I/O device 1400, and the RAM 1500 through a bus 1600. The image sensor 1300 may be embodied by an individual semiconductor chip or combined with the CPU 1100 to form a single semiconductor chip. The image sensor 1300 may be embodied according to some example embodiments described above with reference to FIGS. 1 to 10.

The CPU 1100 may control the system 1000 and exchange data with other components through the bus 1600. For example, the CPU 1100 may receive data generated by the image sensor 1300 according to some example embodiments. The non-volatile memory 1200 may be a memory configured to retain stored data even if power supply is interrupted. For example, the non-volatile memory 1200 may store data generated by the image sensor 1300 or data obtained by processing the generated data. The RAM 1500 may function as a data memory of the CPU 1100 and be a volatile memory device. The I/O device 1400 may receive commands from a user of the system 1000 or output images and/or voice to the user.

While the inventive concepts have been particularly shown and described with reference to embodiments thereof, it will be understood that various changes in form and details may be made therein without departing from the spirit and scope of the following claims.

What is claimed is:

1. A method of manufacturing an image sensor, the image sensor including a first semiconductor chip and a second semiconductor chip, the first semiconductor chip including a plurality of pixels, the second semiconductor chip including a signal processing circuit, the method comprising:
   receiving first manufacturing data associated with a design of the first semiconductor chip;
   receiving second manufacturing data associated with a design of the second semiconductor chip;
   processing the first manufacturing data and the second manufacturing data to determine a predicted capacitance and a predicted resistance of a pixel signal transmission line to which a pixel signal generated by each pixel of the plurality of pixels is transmitted, the predicted capacitance and the predicted resistance corresponding to position information associated with each pixel of the plurality of pixels;
   determining predicted characteristics of the image sensor based on the predicted capacitance and the predicted resistance; and
   electrically connecting the first semiconductor chip and the second semiconductor chip to form the image sensor based on a determination that the predicted characteristics of the image sensor resulting from the electrical connecting of the first semiconductor chip and the second semiconductor chip at least meet a particular set of one or more target values.

2. The method of claim 1, wherein
   the plurality of pixels include a two-dimensional matrix of "i" pixels by "j" pixels, and
   the predicted capacitance and the predicted resistance each vary according to values of "i" and "j".

3. The method of claim 1, wherein the determining the predicted characteristics includes calculating a settling time of the pixel signal.

4. The method of claim 1, further comprising:
   changing the first manufacturing data to generate changed first manufacturing data based on the predicted characteristics of the image sensor.

5. The method of claim 1, further comprising:
   changing the second manufacturing data to generate changed second manufacturing data based on the predicted characteristics of the image sensor.

6. The method of claim 1, wherein
   the signal processing circuit includes a readout circuit configured to receive a separate pixel signal from each pixel of the plurality of pixels, the readout circuit further configured to generate a digital signal, and
   the determining the predicted capacitance and the predicted resistance includes dividing a path into a plurality of sub-paths and determining a sub-capacitance and a sub-resistance of each sub-path of the plurality of sub-paths, the path configured to transmit the separate pixel signal generated by each pixel of the plurality of pixels to the readout circuit.

7. The method of claim 1, wherein
   the first semiconductor chip further includes a row driver configured to transmit a row signal to each pixel of the plurality of pixels,
   the determining the predicted characteristics of the image sensor includes determining the predicted characteristics of the image sensor based on a resistance and a capacitance of a row signal transmission line, the row signal transmission line configured to transmit the row signal from the row driver to each pixel of the plurality of pixels.

8. The method of claim 1, wherein
   the signal processing circuit includes a correlated double sampling circuit (a CDS circuit),
   the determining the predicted characteristics of the image sensor includes determining predicted characteristics of the image sensor based on an equivalent resistance and an equivalent capacitance of the CDS circuit.

9. A method of manufacturing an image sensor, the image sensor including a first semiconductor chip and a second semiconductor chip, the first semiconductor chip including a plurality of pixels, the second semiconductor chip including a signal processing circuit, the method comprising:
   receiving first manufacturing data associated with a design of the first semiconductor chip;
   receiving second manufacturing data associated with a design of the second semiconductor chip;
   processing the first manufacturing data and the second manufacturing data to determine a predicted capacitance and a predicted resistance of a pixel signal transmission line to which a pixel signal generated by each pixel of the plurality of pixels is transmitted;
   determining predicted characteristics of the image sensor based on the predicted capacitance and the predicted resistance; and
   selectively mounting the first semiconductor chip on the second semiconductor chip based on the predicted characteristics of the image sensor.

10. The method of claim 9, wherein the determining the predicted characteristics of the image sensor includes calculating the predicted characteristics of the image sensor based on at least one of a variation between pixel signals, interference, sensitivity, and noise.

11. The method of claim 9, wherein the determining the predicted capacitance and the predicted resistance includes
    dividing the pixel signal transmission line into a plurality of sub-paths;
    determining a sub-capacitance and a sub-resistance of each sub-path of the plurality of sub-paths; and
    combining respective sub-capacitances of the plurality of sub-paths to determine the predicted capacitance and combining respective sub-resistances of the plurality of sub-paths to determine the predicted resistance.

12. The method of claim 9, wherein the pixel signal transmission line is a conductive line extending from an output terminal of the plurality of pixels to an input terminal of the signal processing circuit.

13. The method of claim 9, wherein the selectively mounting the first semiconductor chip on the second semiconductor chip includes selectively mounting the first semiconductor chip on the second semiconductor chip based on a determination of whether the predicted characteristics of the image sensor at least meet one or more target values.

14. The method of claim 9, wherein the first semiconductor chip is electrically connected to the second semiconductor chip through a through-silicon via (TSV).

15. The method of claim 14, further comprising:
changing the first manufacturing data and the second manufacturing data corresponding to the TSV based on the predicted characteristics of the image sensor.

16. A computing system configured to manufacture an image sensor, the image sensor including a first semiconductor chip and a second semiconductor chip, the computing system comprising:
a memory configured to store a program of instructions; and
a processor configured to execute the program of instructions to
receive manufacturing data associated with a design of each semiconductor chip of the first semiconductor chip and the second semiconductor chip, the first semiconductor chip including a plurality of pixels, the second semiconductor chip including a signal processing circuit,
process the manufacturing data to determine a predicted capacitance and a predicted resistance of a pixel signal transmission line to which a pixel signal generated by each pixel of the plurality of pixels is transmitted, the predicted capacitance and the predicted resistance corresponding to position information associated with each pixel of the plurality of pixels, and
determine predicted characteristics of the image sensor based on the predicted capacitance and the predicted resistance.

17. The computing system of claim 16, wherein the processor is further configured to execute the program of instructions to
divide the pixel signal transmission line into a plurality of sub-paths, and
determine a sub-capacitance and a sub-resistance of each sub-path of the plurality of sub-paths,
combine respective sub-capacitances of the plurality of sub-paths to determine the predicted capacitance, and
combine respective sub-resistances of the plurality of sub-paths to determine the predicted resistance.

18. The computing system of claim 16, wherein
the signal processing circuit includes a readout circuit configured to receive a separate pixel signal from each pixel of the plurality of pixels, the readout circuit further configured to generate a digital signal, and
the processor is further configured to execute the program of instructions to calculate a readout speed of the readout circuit based on the predicted capacitance and the predicted resistance.

19. The computing system of claim 16, wherein the processor is further configured to execute the program of instructions to calculate a settling time of the pixel signal based on the predicted capacitance and the predicted resistance.

20. The computing system of claim 16, wherein
the plurality of pixels include a two-dimensional matrix of "i" pixels by "j" pixels, and the predicted capacitance and the predicted resistance each vary according to values of "i" and "j".

* * * * *